(12) United States Patent
Nii

(10) Patent No.: US 6,881,973 B2
(45) Date of Patent: Apr. 19, 2005

(54) INDOLE DERIVATIVE, MATERIAL FOR LIGHT-EMITTING DEVICE AND LIGHT-EMITTING DEVICE USING THE SAME

(75) Inventor: Kazumi Nii, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/744,783

(22) Filed: Dec. 24, 2003

(65) Prior Publication Data
US 2004/0135167 A1 Jul. 15, 2004

Related U.S. Application Data

(62) Division of application No. 10/024,375, filed on Dec. 21, 2001, now Pat. No. 6,693,295.

(30) Foreign Application Priority Data
Dec. 25, 2000 (JP) ................................. P. 2000-392895

(51) Int. Cl.[7] ............................................... H01L 35/24
(52) U.S. Cl. .......................... 257/40; 257/103; 313/504
(58) Field of Search ....................... 252/301.16; 257/40, 257/103; 313/504, 502, 498; 428/917, 690

(56) References Cited

U.S. PATENT DOCUMENTS

| 4,769,292 A | 9/1988 | Tang et al. |
| 5,932,363 A | 8/1999 | Hu et al. |
| 6,224,966 B1 | 5/2001 | Sakai et al. |
| 6,506,505 B1 | 1/2003 | Weber et al. |
| 6,603,150 B1 | 8/2003 | Liao et al. |
| 6,693,295 B1 * | 2/2004 | Nii ............................. 257/40 |

FOREIGN PATENT DOCUMENTS

| JP | 5-339565 | 12/1993 |
| JP | 6-212150 | 8/1994 |
| JP | 6-212151 | 8/1994 |
| JP | 11-260555 | 9/1999 |

* cited by examiner

Primary Examiner—Sara Crane
(74) Attorney, Agent, or Firm—Sughrue Mion, PLLC

(57) ABSTRACT

A compound represented by the following formula (II):

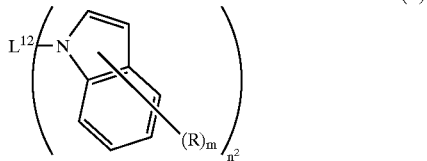

(II)

wherein $L^{12}$ represents one of a from 2- to 6-valent connecting group having a heteroaryl group and a from 2- to 6-valent connecting group comprising a non-conjugate connecting group having an arylene group; $n^2$ represents an integer of from 2 to 6; R represents one of an alkyl group having from 1 to 20 carbon atoms, an aryl group having from 6 to 20 carbon atoms, a heteroaryl group having from 2 to 20 carbon atoms and a silyl group having from 3 to 20 carbon atoms; and m represents an integer of from 0 to 6.

18 Claims, No Drawings

INDOLE DERIVATIVE, MATERIAL FOR LIGHT-EMITTING DEVICE AND LIGHT-EMITTING DEVICE USING THE SAME

CROSS REFERENCE TO RELATED APPLICATION

This is a Divisional Application of prior application Ser. No. 10/024,375 filed Dec. 21, 2001, now U.S. Pat. No. 6,693,295; the disclosure of which is incorporated herein by reference.

FIELD OF THE INVENTION

The present invention relates to a light-emitting device utilizable in the fields of back light, flat panel display, illumination light source, display device, electrophotography, organic semiconductor laser, recording light source, exposure light source, read light source, sign, signboard, optical communication device, etc.

BACKGROUND OF THE INVENTION

Among various light-emitting devices, organic electroluminescent (EL) devices have been actively investigated and developed in recent years, since they can emit luminescence of high luminance at a low driving voltage. In general, the organic electrolight-emitting device is composed of a light-emitting layer and a pair of counter electrodes between which the light-emitting layer is interposed, and electrons injected from the cathode and holes injected from the anode are recombined in the light-emitting layer to generate excitons luminescence from which is utilized.

At present, an organic electrolight-emitting device which emits luminescence of high luminance at a low driving voltage has a stratified structure as described in Tang et al, *Applied Physics Letters*, Vol. 51, page 913 (1987). The organic electrolight-emitting device can emit green luminescence of high luminance by laminating an electron-transporting and luminescent material and a hole-transporting material, and the luminance reaches to several thousands of candelas per square meter at a direct current voltage of 6 to 7 V. However, from the standpoint of practical use, it has been desired to develop a light-emitting device having higher luminance and higher luminous efficiency.

Recently, in order to develop light-emitting devices having higher luminous efficiency, light-emitting devices employing various transition metal complexes as luminescent materials have been investigated. As an light-emitting device which emits in particularly high luminous efficiency, an light-emitting device using an ortho-metalated complex of iridium (tris-orthoiridated complex with 2-phenylpyridine (Ir(ppy)$_3$)) as a luminescent material is reported in *Applied Physics Letters*, Vol. 75, page 4 (1999). The light-emitting device has an external quantum yield of 8.3%. This value exceeds an external quantum yield of 5% which has been regarded as the limit value. However, since it is restricted to a green light-emitting device, development of other color light-emitting devices having higher luminous efficiency is necessary in order to apply to a full-color display or a white light-emitting device.

On the other hand, the organic light-emitting devices which provide luminescence of high luminance are those having a stratified structure of organic substance formed by vacuum deposition. While the production of devices using a coating technique is desirable from the standpoints of simplification of production process, processability, increase in size, etc., the devices produced using any conventional coating technique are inferior to the devices produced by using vacuum deposition in view of the luminance and luminous efficiency. Accordingly, an important subject has been to increase the luminance and luminous efficiency.

SUMMARY OF THE INVENTION

An object of the present invention is to provide a material for light-emitting device which can emit luminescence of high luminance in high luminous efficiency, has excellent stability in repetitions of use at high temperature and enables to homogeneous planer emission, and an light-emitting device employing the same.

Another object of the present invention is to provide a material for light-emitting device which can emit blue luminescence of good color purity in a high luminous efficiency, and an light-emitting device employing the same.

A further object of the present invention is to provide a host material which can emit luminescence of high luminance in high luminous efficiency by doping a transition metal complex having a high quantum yield.

A still further object of the present invention is to provide a material for light-emitting device which can emit luminescence of high luminance in high luminous efficiency and be prepared by a coating technique.

Other objects of the present invention will become apparent from the following description and examples.

The above described objects of the present invention are accomplished by the following items (1) to (14).

(1) A light-emitting device comprising: a pair of electrodes formed on a substrate; and at least one organic compound layer containing a light-emitting layer provided between the electrodes, wherein the at least one organic compound layer comprises a host material, a layer of the host material has an energy gap of from 3.6 eV to 5.2 eV and an ionization potential of the host material is from 5.4 eV to 6.3 eV.

(2) The light-emitting device as described in (1) above, wherein the at least one organic compound layer comprises a compound comprising a partial structure represented by the following formula (I):

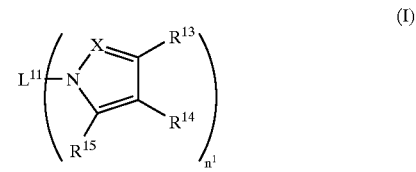

wherein X represents one of a nitrogen atom and C—$R^{12}$; $L^{11}$ represents one of a n$^1$-valent connecting group having a heteroaryl group and a n$^1$-valent connecting group comprising a non-conjugate connecting group having an arylene group; $R^{12}$, $R^{13}$, $R^{14}$ and $R^{15}$ each independently represents one of a hydrogen atom and a substituent; one of the combinations of $R^{12}$ and $R^{13}$, $R^{13}$ and $R^{14}$ and $R^{15}$ and $R^{15}$ may be combined with each other to form a condensed ring; and n$^1$ represents an integer of 2 or more.

(3) The light-emitting device as described in (1) or (2) above, wherein the single layer of the host material has an absorption spectrum having a maximum absorption wavelength of not more than 340 nm.

(4) The light-emitting device as described in any one of (1) to (3) above, wherein the host material comprises a compound comprising a partial structure represented by the following formula (I):

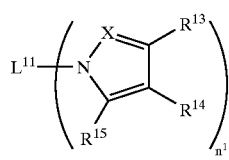

wherein X represents one of a nitrogen atom and C—$R^{12}$; $L^{11}$ represents one of a $n^1$-valent connecting group having a heteroaryl group and a $n^1$-valent connecting group comprising a non-conjugate connecting group having an arylene group; $R^{12}$, $R^{13}$, $R^{14}$ and $R^{15}$ each independently represents one of a hydrogen atom and a substituent; one of the combinations of $R^{12}$ and $R^{13}$, $R^{13}$ and $R^{14}$ and $R^{14}$ and $R^{15}$ may be combined with each other to form a condensed ring; and $n^1$ represents an integer of 2 or more.

(5) The light-emitting device as described in any one of (1) to (4) above, wherein the host material comprises a compound comprising a partial structure represented by the following formula (II):

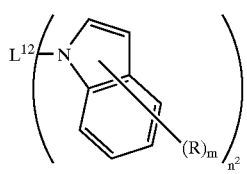

wherein $L^{12}$ represents one of a from 2- to 6-valent connecting group having a heteroaryl group and a from 2- to 6-valent connecting group comprising a non-conjugate connecting group having an arylene group; $n^2$ represents an integer of from 2 to 6; R represents one of an alkyl group having from 1 to 20 carbon atoms, an aryl group having from 6 to 20 carbon atoms, a heteroaryl group having from 2 to 20 carbon atoms and a silyl group having from 3 to 20 carbon atoms; and m represents an integer of from 0 to 6.

(6) The light-emitting device as described in any one of (1) to (5) above, wherein the light-emitting layer comprises at least one luminescent material.

(7) The light-emitting device as described in (6) above, wherein the luminescent material is a transition metal complex.

(8) The light-emitting device as described in (7) above, wherein the transition metal complex is capable of generating luminescence by a transition from a triplet excitation state thereof.

(9) The light-emitting device as described in any one of (1) to (8) above, wherein the light-emitting layer comprises a high molecular compound.

(10) The light-emitting device as described in any one of (1) to (9) above, wherein the light-emitting layer has a thickness of from 1 nm to 5 μm.

(11) The light-emitting device as described in (2) above, wherein the substituent represented by $R^{12}$, $R^{13}$, $R^{14}$ or $R^{15}$ is selected from an alkyl group, an alkenyl group, an alkynyl group, an aralkyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, sulfonyl group, a sulfinyl group, a ureido group, a phosphoric amido group, a hydroxy group, a mercapto group, a halogen atom, a cyano group, a sulfo group, a carboxy group, a nitro group, a hydroxamic acid group, a sulfino group, a hydrazino group, a imino group, a heterocyclic group and a silyl group.

(12) The light-emitting device as described in (2) above, wherein $R^{12}$, $R^{13}$, $R^{14}$ and $R^{15}$ each independently represents one of an alkyl group and an aralkyl group; and the condensed ring formed by the combinations of one of $R^{12}$ and $R^{13}$, $R^{13}$ and $R^{14}$ and $R^{14}$ and $R^{15}$ is selected from benzene, thiophene, furan, pyrrole, imidazole, pyrazole, pyridine, pyrazine, pyridazine, triazole and triazine.

(13) The light-emitting device as described in any one of (7) to (10) above, wherein the transition metal complex is an ortho-metalated metal complex.

(14) The light-emitting device as described in any one of (7) to (10) above, wherein the transition metal complex is an ortho-metalated iridium complex.

(15) The light-emitting device as described in any one of (6) to (10) above, wherein the host material is from 0.1 to 95% by weight based on the luminescent material.

(16) A compound represented by the following formula (II)

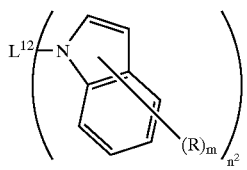

wherein $L^{12}$ represents one of a from 2- to 6-valent connecting group having a heteroaryl group and a from 2- to 6-valent connecting group comprising a non-conjugate connecting group having an arylene group; $n^2$ represents an integer of from 2 to 6; R represents one of an alkyl group having from 1 to 20 carbon atoms, an aryl group having from 6 to 20 carbon atoms, a heteroaryl group having from 2 to 20 carbon atoms and a silyl group having from 3 to 20 carbon atoms; and m represents an integer of from 0 to 6.

DETAIL DESCRIPTION OF THE INVENTION

The present invention will be described in more detail below.

The light-emitting device of the present invention comprises a light-emitting layer or plural organic compound layers containing a light-emitting layer provided between an anode and a cathode. The light-emitting device may have other layers, for example, a hole-injecting layer, a hole-transporting layer, an electron-injecting layer, an electron-transporting layer or a protective layer in addition to the light-emitting layer, and each of the layers may have one or more other functions.

The light-emitting device of the present invention has a maximum luminescence wavelength (λ max) in a blue region of not more than 500 nm. From the standpoint of color purity, the λ max is preferably not more than 495 nm, more preferably not more than 490 nm.

The light-emitting device of the present invention has an external quantum yield of not less than 5%, preferably not less than 7%, more preferably not less than 10%, and ideally 100%. The term "external quantum yield" used herein means a value determined according to the equation described below. Methods for the determination of external quantum yield of the light-emitting device include a method of determining from luminance of luminescence, luminescent spectrum, a luminosity curve and current density and a method for determining from current density and a number of total photons emitted.

External quantum yield (%)=(number of total photons emitted/ number of electrons injected to light-emitting device)×100

According to the first embodiment of the present invention, the light-emitting device comprises a substrate having thereon a pair of electrodes and a light-emitting layer or organic compound layers containing a light-emitting layer provided between the electrodes, wherein the light-emitting layer or the organic compound layers contains a host material, a layer of the host material has an energy gap of not less than 3.6 eV and not more than 5.2 eV and an ionization potential of the host material is from 5.4 to 6.3 eV, more preferably from 5.8 to 6.3 eV. When the ionization potential of the host material is out of the above-described range, the luminous efficiency of the light-emitting device may decrease.

The energy gap (band gap) is determined from light absorption of a layer of the host material or a layer containing the host material dispersed in polycarbonate according to the method described in Ono et al, J. Phys. Soc. Japan., Vol. 58, page 1895 (1989). The ionization potential is determined by measuring an ionization potential of the layer using a photoelectron spectrometer (AC-1 Type manufactured by Riken Keiki Co., Ltd.).

According to the second embodiment of the present invention, in the light-emitting device described in the first embodiment, the layer of the host material has an absorption spectrum having a maximum absorption wavelength of from 240 nm to 340 nm.

According to the third embodiment of the present invention, the light-emitting device comprises a substrate having thereon a pair of electrodes and a light-emitting layer or organic compound layers containing a light-emitting layer provided between the electrodes, wherein the light-emitting layer or the organic compound layers comprises a compound comprising a partial structure represented by the following formula (I):

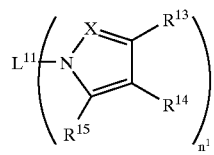

(I)

wherein X represents a nitrogen atom or C—$R^{12}$; $L^{11}$ represents one of a $n^1$-valent connecting group having a heteroaryl group and a $n^1$-valent connecting group comprising a non-conjugate connecting group having an arylene group; $R^{12}$, $R^{13}$, $R^{14}$ and $R^{15}$, which may be the same or different, each represents a hydrogen atom or a substituent; any one of the combinations of $R^{12}$ and $R^{13}$, $R^{13}$ and $R^{14}$ and $R^{14}$ and $R^{15}$ may be combined with each other to form a condensed ring; and $n^1$ represents an integer of 2 or more.

Examples of the above-described substituent include an alkyl group (preferably having from 1 to 20 carbon atoms, more preferably having from 1 to 12 carbon atoms, particularly preferably having from 1 to 8 carbon atoms, for example, methyl, ethyl, isopropyl, tert-butyl, n-octyl, n-decyl, n-hexadecyl, cyclopropyl, cyclopentyl, or cyclohexyl), an alkenyl group (preferably having from 2 to 20 carbon atoms, more preferably having from 2 to 12 carbon atoms, particularly preferably having from 2 to 8 carbon atoms, for example, vinyl, ally, 2-butenyl, or 3-pentenyl), an alkynyl group (preferably having from 2 to 20 carbon atoms, more preferably having from 2 to 12 carbon atoms, particularly preferably having from 2 to 8 carbon atoms, for example, propargyl, or 3-pentynyl), an aralkyl group (preferably having from 7 to 20 carbon atoms, more preferably having from 7 to 16 carbon atoms, particularly preferably having from 7 to 10 carbon atoms, for example, benzyl, or phenethyl), an aryl group (preferably having from 6 to 30 carbon atoms, more preferably having from 6 to 20 carbon atoms, particularly preferably having from 6 to 12 carbon atoms, for example, phenyl, p-methylphenyl, or naphthyl), an amino group (preferably having from 0 to 20 carbon atoms, more preferably having from 0 to 10 carbon atoms, particularly preferably having from 0 to 6 carbon atoms, for example, amino, methylamino, dimethylmino, diethylamino, or dibenzylamino), an alkoxy group (preferably having from 1 to 20 carbon atoms, more preferably having from 1 to 12 carbon atoms, particularly preferably having from 1 to 8 carbon atoms, for example, methoxy, ethoxy, or butoxy), an aryloxy group (preferably having from 6 to 20 carbon atoms, more preferably having from 6 to 16 carbon atoms, particularly preferably having from 6 to 12 carbon atoms, for example, phenyloxy, or 2-naphthyloxy), an acyl group (preferably having from 1 to 20 carbon atoms, more preferably having from 1 to 16 carbon atoms, particularly preferably having from 1 to 12 carbon atoms, for example, acetyl, benzyl, formyl, or pivaloyl), an alkoxycarbonyl group (preferably having from 2 to 20 carbon atoms, more preferably having from 2 to 16 carbon atoms, particularly preferably having from 2 to 12 carbon atoms, for example, methoxycarbonyl, or ethoxycarbonyl), an aryloxycarbonyl (preferably having from 7 to 20 carbon atoms, more preferably having from 7 to 16 carbon atoms, particularly preferably having from 7 to 10 carbon atoms, for example, phenyloxycarbonyl), an acyloxy group (preferably having from 2 to 20 carbon atoms, more preferably having from 2 to 16 carbon atoms, particularly preferably having from 2 to 10 carbon atoms, for example, acetoxy, or benzoyloxy), an acylamino group (preferably having from 2 to 20 carbon atoms, more preferably having from 2 to 16 carbon atoms, particularly preferably having from 2 to 10 carbon atoms, for example, acetylamino, or benzoylamino), an alkoxycarbonylamino group (preferably having from 2 to 20 carbon atoms, more preferably having from 2 to 16 carbon atoms, particularly preferably having from 2 to 12 carbon atoms, for example, methoxycarbonylamino), an aryloxycarbonylamino group (preferably having from 7 to 20 carbon atoms, more preferably having from 7 to 16 carbon atoms, particularly preferably having from 7 to 12 carbon atoms, for example, phenyloxycarbonylamino), a sulfonylamino group (preferably having from 1 to 20 carbon atoms, more preferably having from 1 to 16 carbon atoms, particularly preferably having from 1 to 12 carbon atoms, for example, methanesulfonylamino, or benzenesulfonylamino), a sulfamoyl group (preferably having from 0 to 20 carbon atoms, more preferably having from 0 to 16 carbon atoms, particularly preferably having from 0 to 12 carbon atoms, for example, sulfamoyl, methylsulfamoyl, dimethylsulfamoyl, or phenylsulfamoyl), a carbamoyl group (preferably having from 1 to 20 carbon atoms, more preferably having from 1 to 16 carbon atoms, particularly preferably having from 1 to 12 carbon atoms, for example, carbamoyl, methylcarbamoyl, diethylcarbamoyl, or phenylcarbamoyl), an alkylthio group (preferably having from 1 to 20 carbon atoms, more preferably having from 1 to 16 carbon atoms, particularly preferably having from 1 to 12 carbon atoms, for example, methylthio, orethylthio), an arylthiogroup (preferably having from 6 to 20 carbon atoms, more preferably having from 6 to 16 carbon atoms, particularly preferably having from 6 to 12 carbon atoms, for example, phenylthio), a sulfonyl group (preferably having from 1 to 20 carbon atoms, more preferably having from 1 to 16 carbon atoms, particularly preferably having from 1 to 12 carbon atoms, for example, mesyl, or tosyl), a sulfinyl group (preferably having from 1 to 20 carbon atoms, more preferably having from 1 to 16 carbon atoms, particularly preferably having from 1 to 12 carbon atoms, for example, methanesulfinyl, or benzenesulfinyl), a ureido group (preferably having from 1 to 20 carbon atoms, more preferably having from 1 to 16 carbon atoms, particularly preferably having from 1 to 12 carbon atoms, for example, ureido, methylureido, or phenylureido), a phosphoric amido group (preferably having from 1 to 20 carbon atoms, more preferably having from 1 to 16 carbon atoms, particularly preferably having from 1 to 12 carbon atoms, for example, diethylphosphoric amide, or phenylphosphoric amido), a hydroxy group, a mercapto group, a halogen atom (for example, fluorine, chlorine, bromine or iodine), a cyano group, a sulfo group, a carboxy group, a nitro group, a hydroxamic acid group, a sulfino group, a hydrazino group, an imino group, a heterocyclic group (preferably having from 1 to 20 carbon atoms, more preferably having from 1 to 12 carbon atoms, and including, for example, a nitrogen atom, an oxygen atom or a sulfur atom, as the heteroatom, specifically, derived from pyrrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, phenazine, tetrazole, benzimidazole, benzoxazole, benzothiazole, benzotriazole, or tetraazaindene), and a silyl group (preferably having from 3 to 40 carbon atoms, more preferably having from 3 to 30 carbon atoms, particularly preferably having from 3 to 24 carbon atoms, for example, trimethylsilyl, or triphenylsilyl). The substituent may be further substituted. When two or more substituents are present, they may be the same or different. Further, the substituents may be combined with each other to form a ring, if possible.

Preferred examples of the substituent include an alkyl group, an alkenyl group, an aralkyl group, an aryl group, an alkoxy group, an aryloxy group, an amino group, an acyl group, an alkoxycarbonyl group, an aryloxycarbonyl group, a carbonylamino group, a sulfonylamino group, a sulfamoyl group, a carbamoyl group, a hydroxy group, a heterocyclic group, an acylamino group, an alkoxycarbonylamino group, an aryloxycarbonylamino group, an alkylthio group, an arylthio group, a sulfonyl group, a sulfinyl group, a halogen atom, a cyano group and silyl group. More preferred examples of the substituent include an alkyl group, an alkenyl group, an aralkyl group, an aryl group, an alkoxy group, an amino group, an acylamino group, an alkoxycarbonylamino group, an aryloxycarbonylamino group, a sulfonylamino group, an alkylthio group, an arylthiogroup, a sulfonyl group, a sulfinyl group, a halogen atom, a cyano group, a heterocyclic group and silyl group.

Still more preferred examples of the substituent include an alkyl group, an aralkyl group, an alkoxy group, a substituted amino group, an alkylthio group, an arylthio group, a sulfonyl group, a sulfinyl group, a cyano group, a heterocyclic group and silyl group. The substituted amino group is a group represented by —N($R_a$) ($R_b$) (wherein $R_a$ and $R_b$, which may be the same or different, each represents an alkyl group, an alkenyl group, an aralkyl group, an aryl group or a heterocyclic group) The alkyl group, alkenyl group, aralkyl group, aryl group and heterocyclic group have the same meanings as the substituents described above, respectively.

Particularly preferably, $R^{12}$, $R^{13}$, $R^{14}$ and $R^{15}$ each represents an alkyl group, an aralkyl group, an aryl group, a heteroaryl group or a silyl group.

Any one of the combinations of $R^{12}$ and $R^{13}$, $R^{13}$ and $R^{14}$ and $R^{14}$ and $R^{15}$ may be combined with each other to form a condensed ring. The condensed ring formed is preferably an aromatic ring comprising a carbon atom, a nitrogen atom and/or a sulfur atom, and includes specifically benzene, thiophene, furan, pyrrole, imidazole, pyrazole, pyridine, pyrazine, pyridazine, triazole and triazine. Benzene and pyridine are particularly preferred.

$L^{11}$ represents an $n^1$-valent connecting group having a heteroaryl group or an $n^1$-valent connecting group comprising a non-conjugate connecting group having an arylene group, wherein $n^1$ represents an integer of 2 or more.

The heteroaryl group has as a hetero atom preferably a nitrogen atom, a sulfur atom, or an oxygen atom, more preferably a nitrogen atom and, further preferably from 2 to 20 carbon atoms; specific examples thereof include pyridine, piperidine, pyrazine, triazine, thiophene, quinoline, quinoxaline and the like. Among other things, pyridine, piperidine, pyrazine, and triazine are preferable. The arylene group preferably has from 6 to 20 carbon atoms; specific examples thereof include phenylene, naphthylene, anthracenylene, phenanthrylene, pyrenylene, triphenylene and the like. Among other things, phenylene is preferable.

Examples of non-conjugate bonding portions of the non-conjugate connecting groups include an arylene group bonded at a meta position, an alkylene group, a silyl group, —O—, —N= and the like.

$L^{11}$ represents a connecting group comprising preferably a phenylene group bonded at a meta position, a combination of benzene and methylene, a combination of benzene and a substituted or non-substituted methine group, a combination of benzene and a substituted or non-substituted silyl group.

Preferable examples of $L^{11}$ include groups described below.

A subscript "p" appended to a parenthesis represents a repeating unit and refers to from 1 to 500.

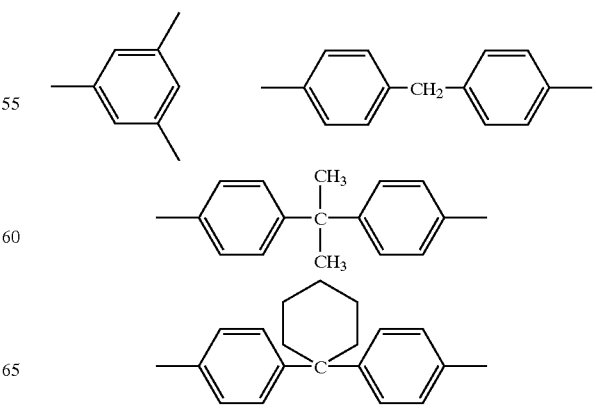

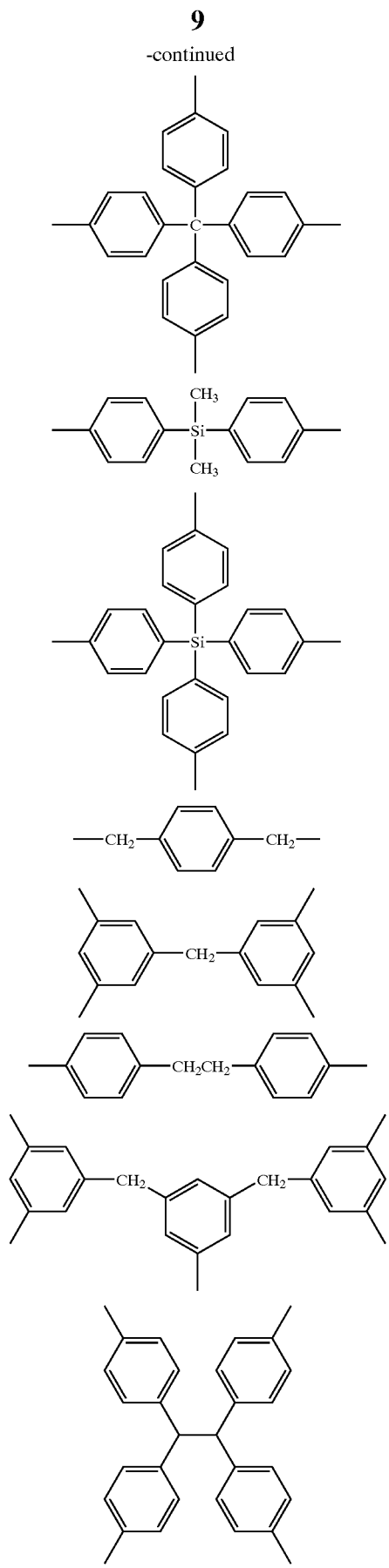

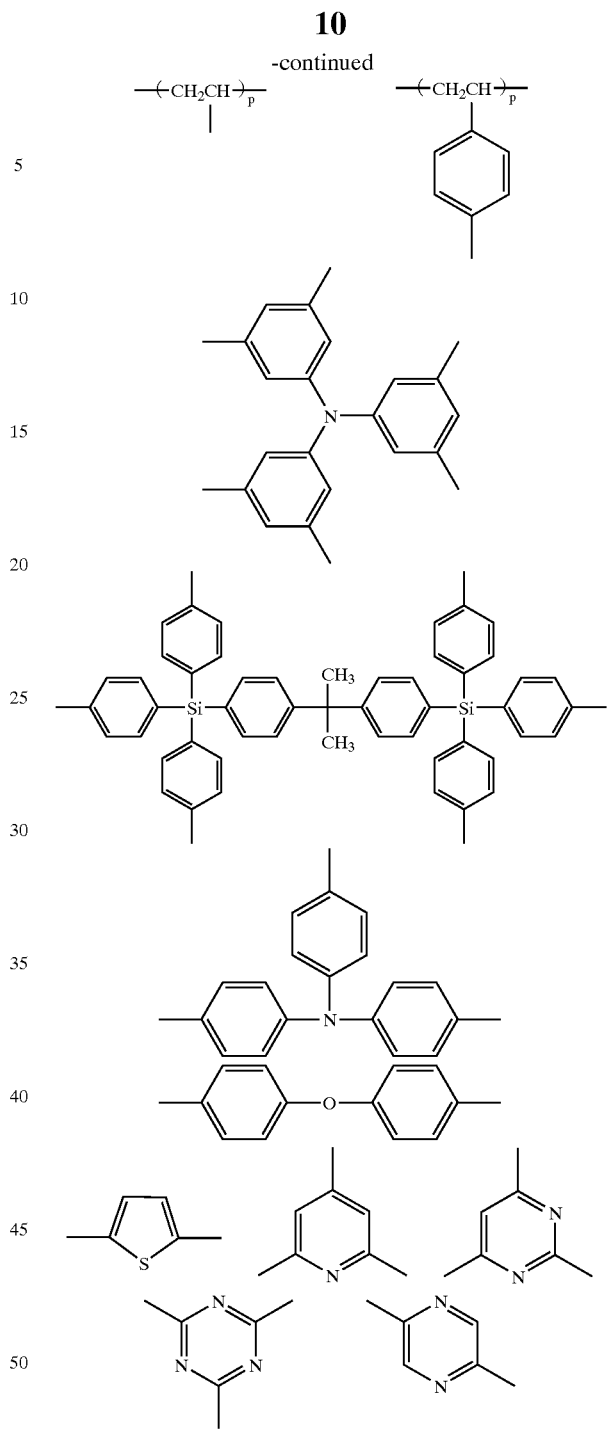

The compound represented by formula (I) may be a low molecular weight compound, and preferably includes compounds having from 2 to 10 azole ring units represented by formula (I). $n^1$ represents an integer of preferably from 2 to 10, more preferably from 2 to 6, and even more preferably from 2 to 6. The compound represented by formula (I) may also be a high molecular weight compound in which the unit represented by formula (I) is present in its side chain (having a weight average molecular weight of preferably from $1\times10^3$ to $5\times10^6$, more preferably from $5\times10^3$ to $2\times10^6$, and still more preferably from $1\times10^4$ to $1\times10^6$), or a high molecular weight compound containing a skeleton represented by formula (I) in its main chain (having a weight average molecular weight of preferably from $1\times10^3$ to $5\times10^6$, more preferably from $5 \times 10^3$ to $2 \times 10^6$, and still more preferably from $1 \times 10^4$ to $1 \times 10^6$;. In case of the high molecular weight compounds, they maybe homopolymers or copolymers containing other monomer units.

Of the compounds represented by formula (I), a compound represented by formula (II) is preferred.

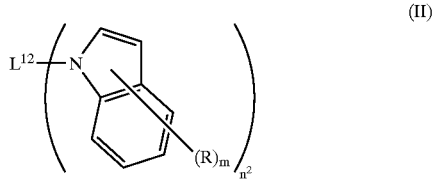

(II)

wherein $L^{12}$ is synonymous with $L^{11}$ expressed by the general formula (I), further, a preferred range thereof is the same as that of $L^{11}$; $n^2$ is an integer of from 2 to 6; R represents an alkyl group having from 1 to 20 carbon atoms, an aryl group having from 6 to 20 carbon atoms, a heteroaryl group having from 2 to 20 carbon atoms, or a silyl group having from 3 to 20 carbon atoms and, preferably an alkyl group having from 1 to 16 carbon atoms, an aryl group having from 6 to 16 carbon atoms, or a silyl group having from 3 to 16 carbon atoms; and m represents an integer of from 0 to 6.

Specific examples of the compound represented by formula (I) are set forth below, but the present invention should not be construed as being limited thereto. In the following formulae of the compounds, n, q and r attached to parentheses each denotes a number of the repeating unit, which represents an integer of from 1 to 500.

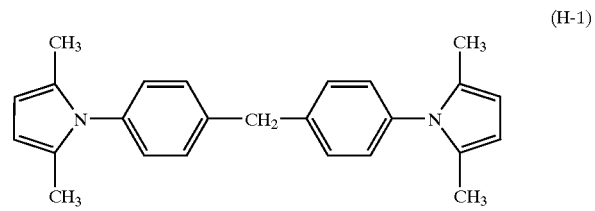

(H-1)

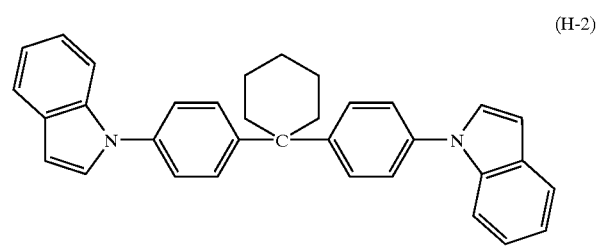

(H-2)

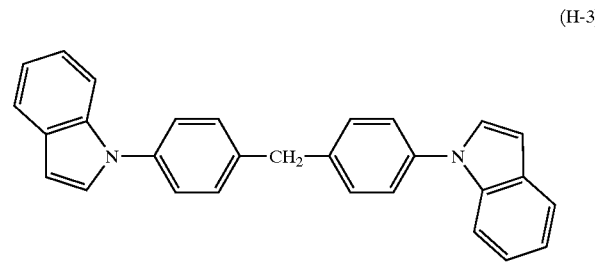

(H-3)

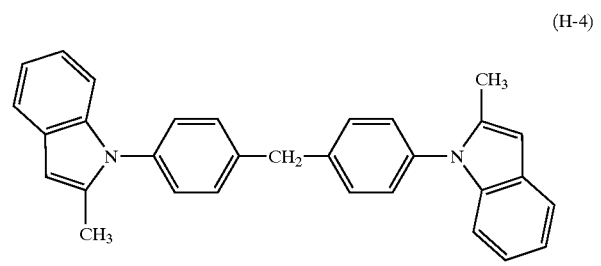

(H-4)

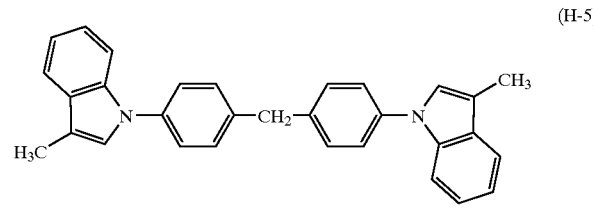

(H-5)

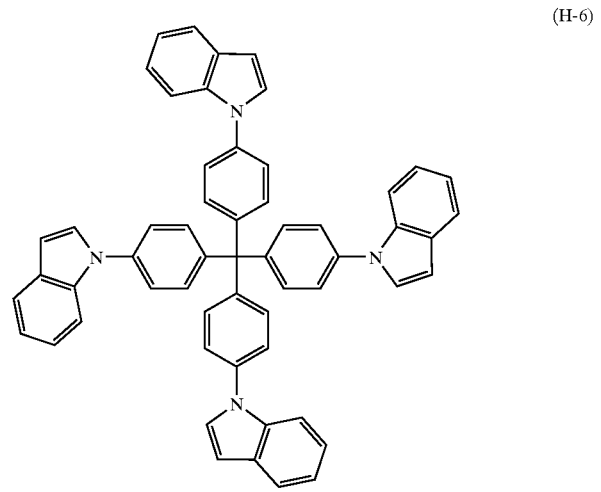

(H-6)

-continued
(H-7)
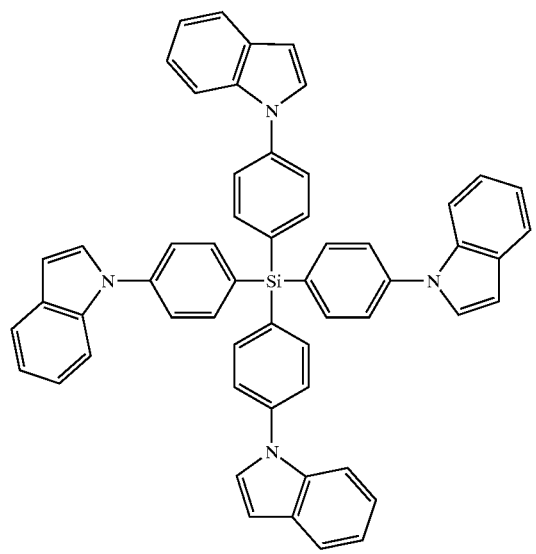
(H-8)
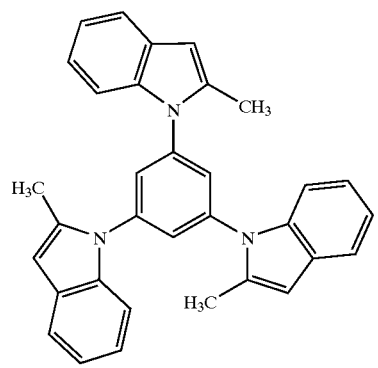
(H-9)
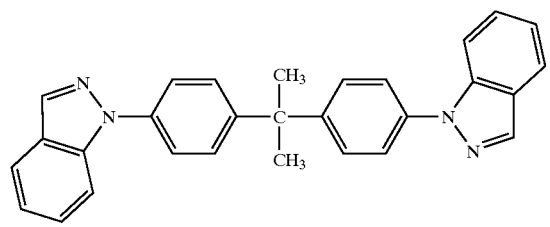
(H-10)
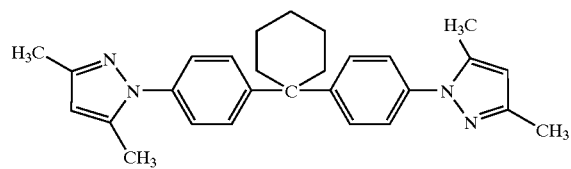
(H-11)
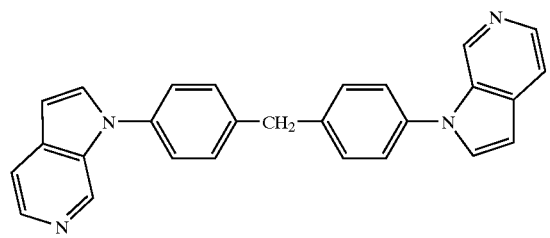
(H-12)
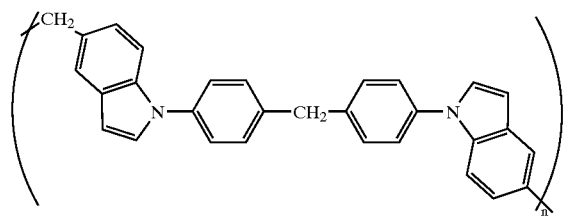
(H-13)
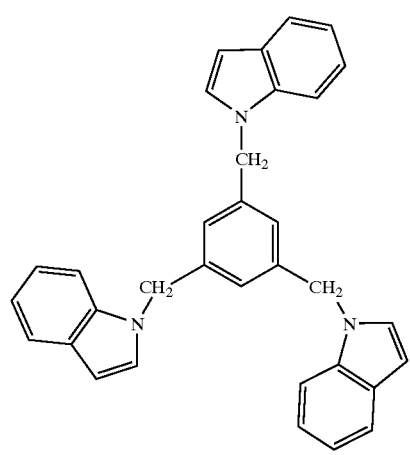
(H-14)
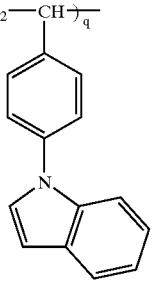

-continued
(H-15)
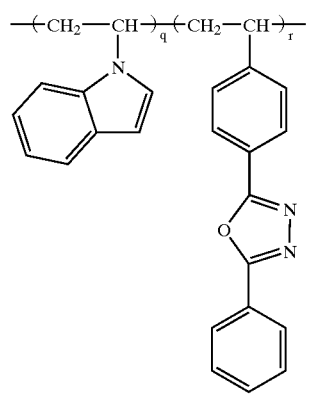
(H-16)
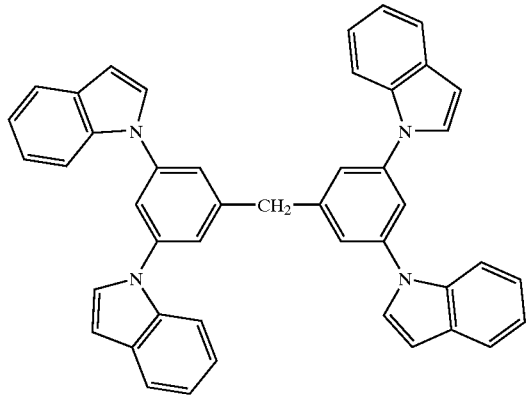
(H-17)
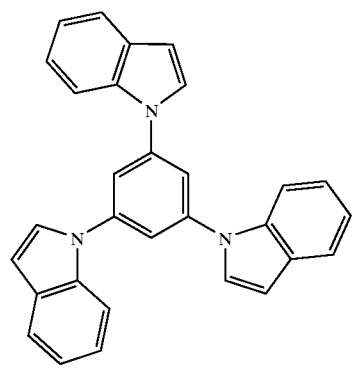
(H-18)
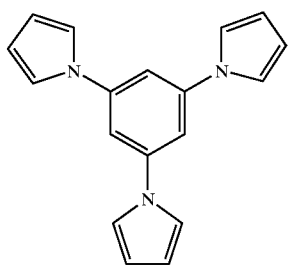
(H-19)
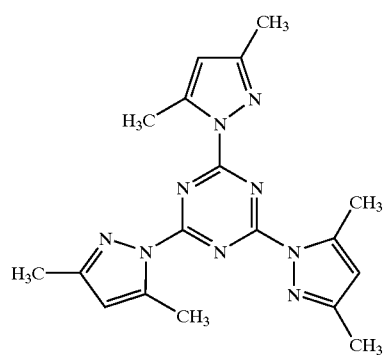
(H-20)
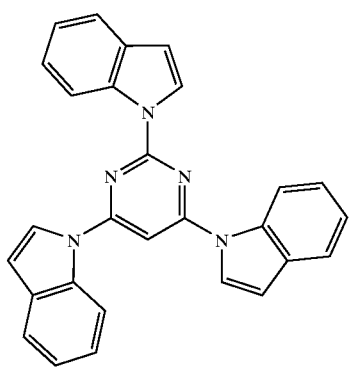
(H-21)
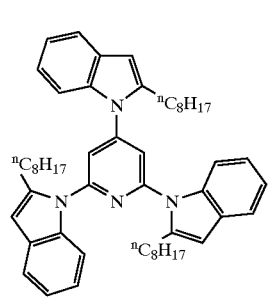
(H-22)
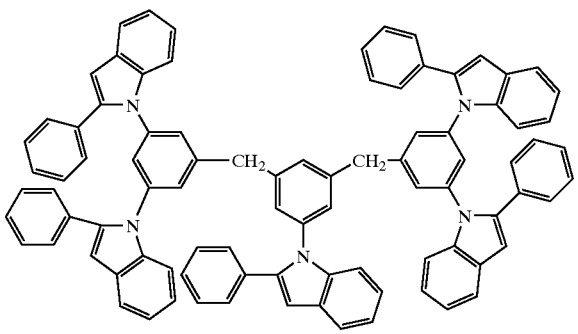

(H-23)
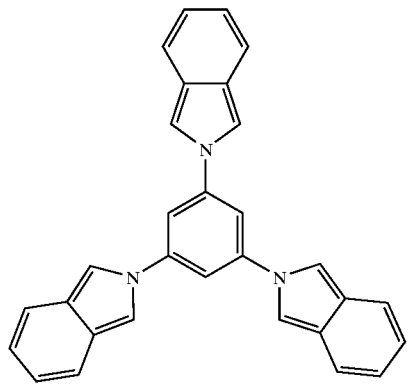
(H-24)
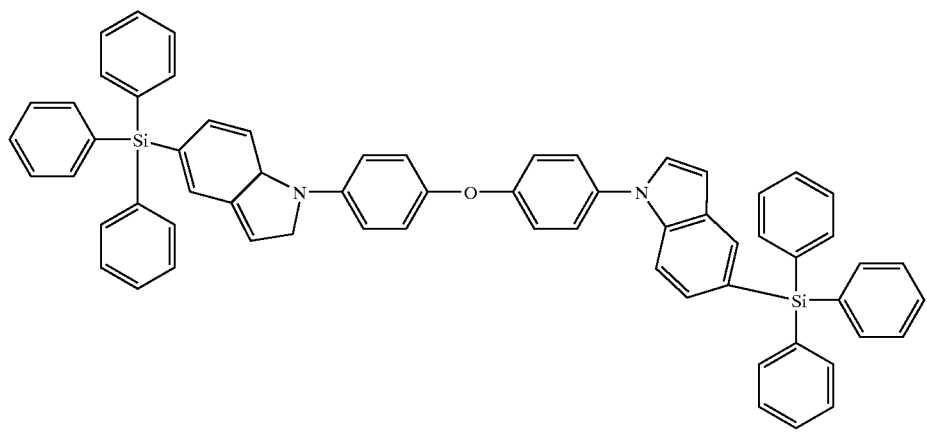
(H-25)
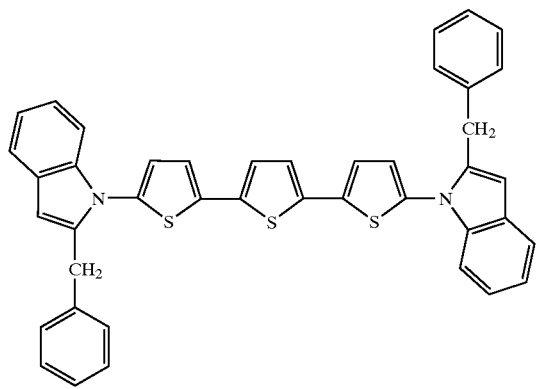
(H-26)
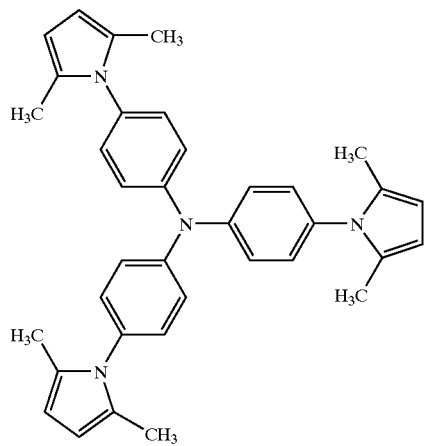

(H-27)
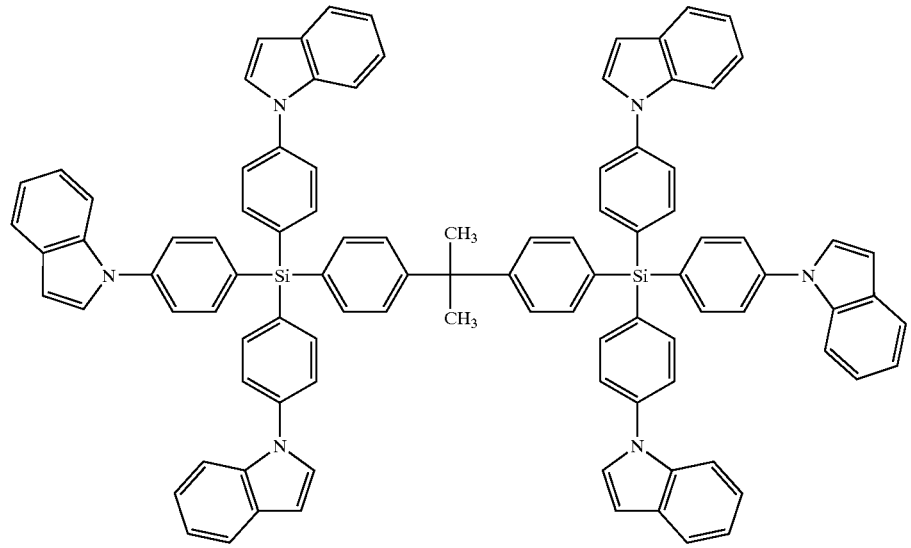
(H-28)
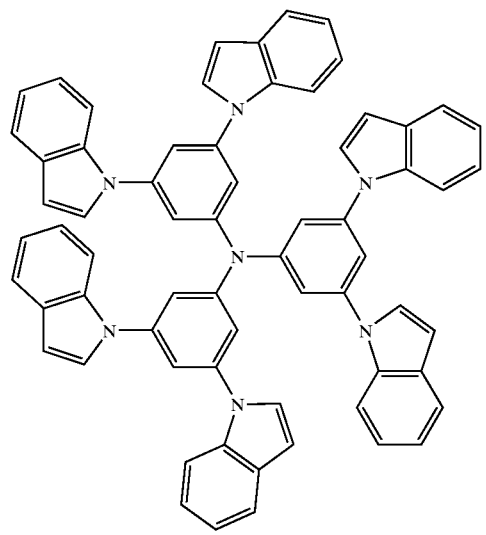
(H-29)
(H-30)
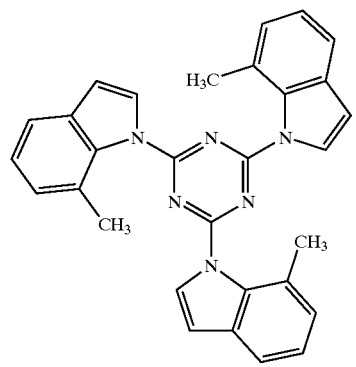
(H-31)
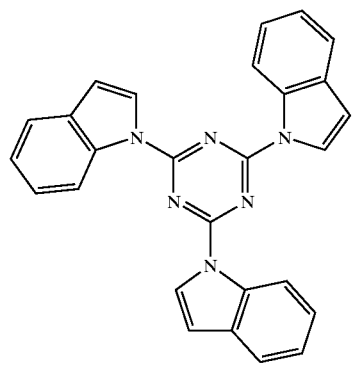

-continued
(H-32) 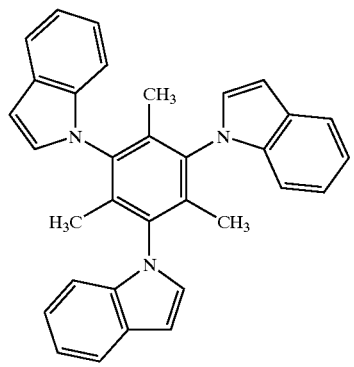
(h-33) 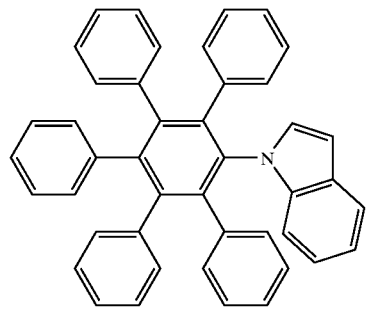
(H-34) 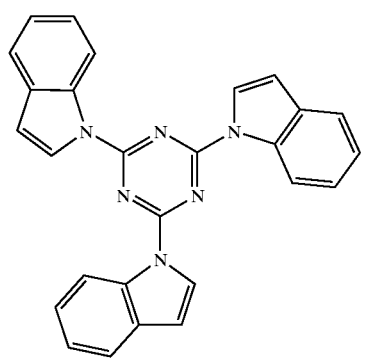
(H-35) 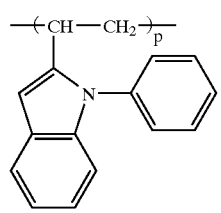
(H-36) 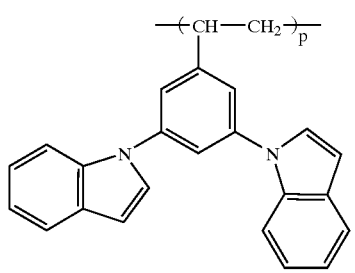
(H-37) 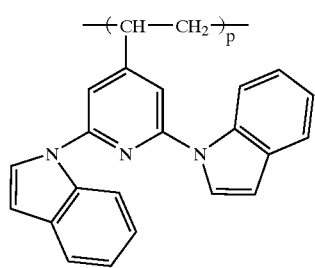
(H-38) 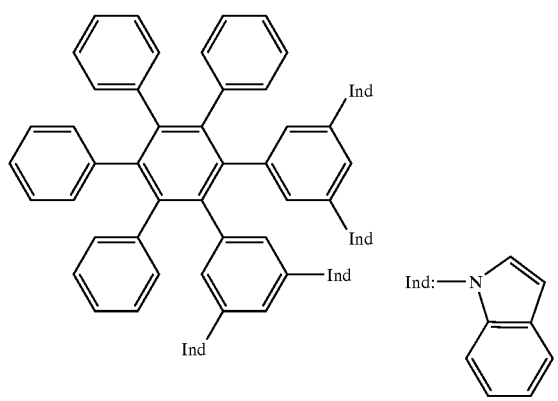
Ind: 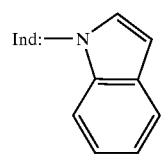

Synthesis examples of the compound represented by formula (I) according to the present invention are described below.

SYNTHESIS EXAMPLE 1
Synthesis of Compound (H-1)

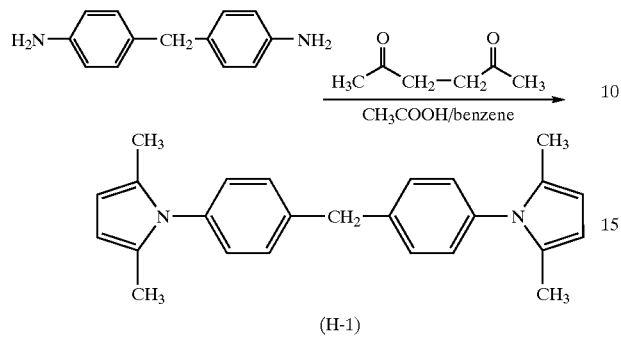

(H-1)

To a solution prepared by dissolving 5.95 g of 4,4-diaminodiphenylmethane and 3.77 g of 2,5-hexanedione in 100 ml of benzene was added one ml of acetic acid, and the mixture was refluxed by heating for 8 hours to remove the resulting water using a Dean-Stark distilling receiver. After the completion of the reaction, the reaction solution was allowed to stand for cooling and diluted with ethyl acetate. The ethyl acetate solution was washed with an aqueous solution of diluted hydrochloric acid and then an aqueous solution of sodium hydrogen carbonate, and concentrated. The resulting oil was purified by a silica gel chromatography and subjected to recrystallization from a solvent mixture of chloroform and ethanol to obtain 3 g of Compound (H-1). A melting point of Compound (H-1) was 128 to 130° C.

SYNTHESIS EXAMPLE 2
Synthesis of Compound (H-3)

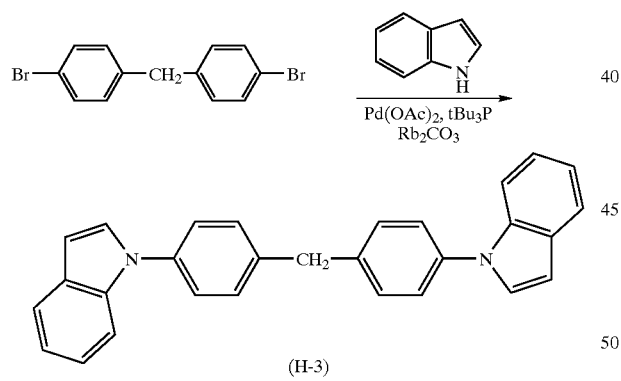

(H-3)

To a solution prepared by dissolving 1.9 g of indole in 70 ml of o-xylene were added 11.1 g of rubidium carbonate, 0.036 g of palladium acetate, 2.6 g of 4,4-dibromodiphenylmethane and 0.1 g of tert-butylphosphine in this order under a nitrogen atmosphere, and the mixture was heated at 120° C. with stirring for 3 hours. After the completion of the reaction, ethyl acetate was added to the reaction solution, followed by filtering with Celite to remove the insoluble substance. The resulting ethyl acetate solution was washed with water, dehydrated and concentrated. The crystals obtained were purified by a silica gel chromatography and subjected to recrystallization from a solvent mixture of chloroform and ethanol to obtain 0.92 g of Compound (H-3). A melting point of Compound (H-3) was 110 to 111° C.

SYNTHESIS EXAMPLE 3
Synthesis of Compound (H-17)

Compound (H-17) was synthesized in the same manner as in SYNTHESIS EXAMPLE 2, according to the following scheme. A melting point of Compound (H-17) was 228 to 232° C.

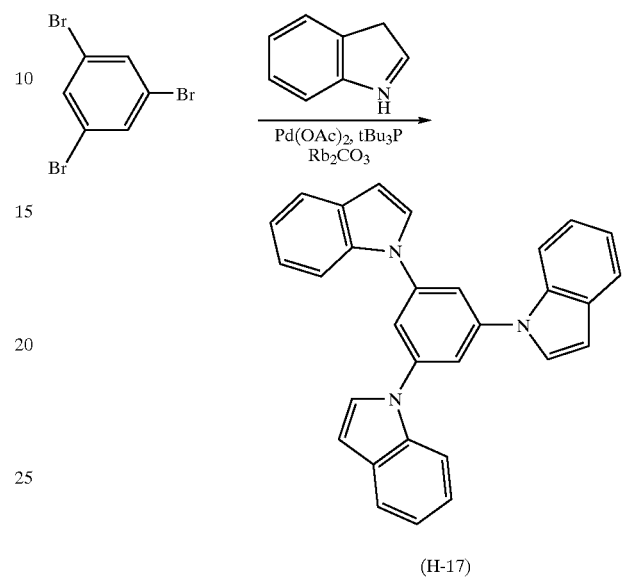

(H-17)

SYNTHESIS EXAMPLE 4

Compound (H-7) was synthesized in the same manner as in SYNTHESIS EXAMPLE 2, according to the following scheme. A melting point of Compound (H-7) was 292 to 298° C.

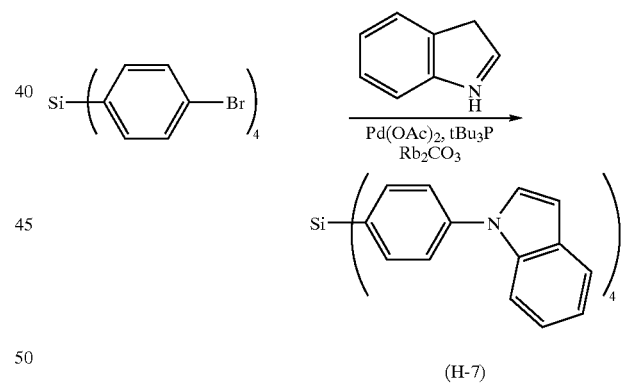

(H-7)

At least one of the luminescent materials for use in the light-emitting device according to the present invention is a compound having the luminescent maximum of luminescence resulting from exciton in a blue region. The luminescent material includes, for example, a transition metal complex, preferably an iridium complex, an osmium complex and a platinum complex, more preferably an iridium complex and a platinum complex, and still more preferably an ortho-metalated iridium complex.

The transition metal complex for use in the present invention is preferably light-emitting, and a phosphorescent compound is particularly preferred in view of the luminous efficiency. The term "phosphorescent compound" means a compound which emits light resulting from a triplet exciton. The phosphorescent compound has a higher luminous efficiency than a substance utilizing fluorescent emission resulting from a singlet exciton, since it utilizes phosphorescent emission. The phosphorescent compound is not particularly limited, but the ortho-metalated metal complex is preferably used.

The transition metal complex may be a compound containing one transition metal atom or a multi-nuclei complex containing two or more transition metal atoms. Different kinds of metal atoms may be simultaneously incorporated into the transition metal complex.

A ligand of the transition metal complex is not particularly limited and includes, for example, ligands described in G. Wilkinson et al, *Comprehensive Coordination Chemistry*, Pergamon Press (1987), H. Yersin, *Photochemistry and Photophysics of Coordination Compounds*, Springer-Verlag (1987) and Akio Yamamoto, *Organometallic Chemistry-Principles and Applications-*, Shokabo Publishing Co. Ltd. (1982). Preferred examples of the ligand include a halogen ligand, a nitrogen-containing heterocyclic ligand (e.g., phenylpyridine, benzoquinone, quinolinol, bipyridyl or phenanthroline), a diketone ligand (e.g., acetylacetone), a carboxylic acid ligand (e.g., acetic acid ligand), a phosphoric acid ligand (e.g., triphenylphosphinic acid ligand or a phosphorous acid ester ligand), a carbon monoxide ligand, an isonitrile ligand and a cyano ligand.

In the transition metal complex, one kind or two or more kinds of the ligands maybe used. A number of the kinds of ligands in the transition metal complex is preferably one or two.

The term "ortho-metalated complex" used in the present invention is a generic name given to compounds described, for example, in Akio Yamamoto, *Organometallic Chemistry-Principles and Applications-*, pages 150 and 232, Shokabo Publishing Co. Ltd. (1982). While the center metal of the ortho-metalated complex is not particularly limited as far as a transition metal is used same as in the transition metal complex described above, rhodium, platinum, gold, iridium, ruthenium, palladium, etc. is preferably used in the present invention. Iridium is more preferably used. Specific description and examples of the ortho-metalated complex can be found in Japanese Patent Application No. 2000-254171.

The light-emitting layer according to the present invention may contain a high-molecular weight compound, preferably a resin component in addition to the luminescent material. Examples of the resin component include polyvinyl chloride, polycarbonate, polystyrene, polymethyl methacrylate, polybutylmethacrylate, polyester, polysulfone, polyphenylene oxide, polybutadiene, poly(N-vinylcarbazole), hydrocarbon resin, ketone resin, phenoxy resin, polyamide, ethyl cellulose, polyvinyl acetate, ABS resin, polyurethane, melamine resin, unsaturated polyester resin, alkyd resin, epoxy resin and silicone resin. When a coating method (for example, a spin coating method, a cast coating method or a dip coating method) is used for the formation of light-emitting layer, the formation of the layer can be conducted easily, since the luminescent material can be dissolved or dispersed together with the high-molecular weight compound (resin component).

The light-emitting device of the present invention can be used as far as it is a device in which the compound according to the present invention is employed irrespective of a system, a driving method and a form of use. It is preferred, however, to utilize the compound according to the present invention together with a luminescent material as a host of the light-emitting layer or to utilize as a charge-transporting material in the absence of a luminescent material. An organic electroluminescent (EL) device is a representative example of the light-emitting device.

A mixing rate of the compound according to the present invention, when it is used together with a luminescent material, is from 0.1 to 95% by weight, preferably from 0.1 to 30% by weight, and particularly preferably from 0.1 to 10% by weight, based on the luminescent material.

A method for the formation of organic layer of the light-emitting device containing the compound according to the present invention is not particularly restricted and, for example, a vapor deposition method with resistance heating, an electron beam method, a spattering method, a molecular-layer accumulation method, a coating method, an ink jet method, a printing method, a transfer method or electrophotographic method can be used. Among them, the vapor deposition method with resistance heating, coating method or transfer method is preferred from the standpoints of the characteristics and production. Further, the coating method is more preferred in view of avoiding thermal decomposition at the deposition.

The light-emitting device of the present invention comprises a pair of electrodes, i.e., an anode and a cathode, and a light-emitting layer or plural thin organic compound layers containing a light-emitting layer provided between the electrodes. The light-emitting device may have other layers, for example, a hole-injecting layer, a hole-transporting layer, an electron-injecting layer, an electron-transporting layer or a protective layer in addition to the light-emitting layer. Each of the layers may have one or more other functions. In order to form each layer, various materials can be employed.

The anode serves to feed holes to the hole-injecting layer, hole-transporting layer, light-emitting layer, etc. It can be made of metal, an alloy, a metal oxide, an electro-conductive compound, a mixture thereof, or the like, and is preferably made of a material having a work function of not less than 4 eV. Specific examples of the anode material include an electro-conductive metal oxide, for example, tin oxide, zinc oxide, indium oxide or indium-tin oxide (ITO), metal, for example, gold, silver, chromium or nickel, a mixture or laminate of the metal and the electro-conductive metal oxide, an inorganic electro-conductive substance, for example, copper iodide or copper sulfide, an organic electro-conductive material, for example, polyaniline, polythiophene or polypyrrole, and a laminate of the inorganic electro-conductive substance br organic electro-conductive material with ITO. Among them, the electro-conductive metal oxide id preferred. In particular, the ITO is preferred from the standpoints of productivity, high electro-conductivity, transparency, etc. Although a thickness of the anode can be appropriately determined depending on the material to be used, it is preferably in a range of from 10 nm to 5 $\mu$m, more preferably from 50 nm to 1 $\mu$m, and still more preferably from 100 nm to 500 nm.

The anode, which is used in the present invention, ordinarily comprises a layer formed on a substrate, for example, a soda-lime glass plate, an alkali-free glass plate or a transparent resin plate. In the case of using glass, the alkali-free glass is preferably used as material in order to diminish ion dissolution from the glass. In the case of using the soda-lime glass, it is preferred to provide a barrier coat comprising, for example, silica. A thickness of the substrate is not particularly limited as far as it is sufficient for maintaining its mechanical strength. However, in case of using glass, the thickness thereof is ordinarily not less than 0.2 mm, preferably not less than 0.7 mm.

Various methods can be used for the formation of anode depending on the material to be used. For instance, in case of ITO, an electron beam method, a sputtering method, a vapor deposition method with resistance heating, a chemical reaction method (e.g., a sol-gel method) or a method of coating a dispersion of indium-tin oxide is used to form a layer. Cleaning or other treatment of the anode is effective for decreasing the driving voltage of light-emitting device and increasing the luminous efficiency. For example, incase of ITO, an UV-ozone treatment or a plasma treatment is effectively used.

The cathode serves to feed electrons to the electron-injecting layer, electron-transporting layer, light-emitting layer, etc., and selected taking, for example, adhesion to a layer adjacent to the negative electrode, e.g., the electron-injecting layer, electron-transporting layer, light-emitting layer, etc., ionization potential or stability into consideration. A material for the cathode includes metal, an alloy, a metal halide, a metal oxide, an electro-conductive compound and a mixture thereof. Specific examples thereof include an alkali metal (e.g., Li, Na, K or Cs), a fluoride or oxide thereof, an alkaline earth metal (e.g., Mg or Ca), a fluoride or oxide thereof, gold, silver, lead, aluminum, a sodium-potassium alloy or a mixture of the metals, a lithium-aluminum alloy or a mixture of the metals, a magnesium-silver alloy or a mixture of the metals, and a rare earth metal, e.g., indium or ytterbium. The materials having a work function of not more than 4 eV are preferably used. Aluminum, a lithium-aluminum alloy or a mixture of the metals and a magnesium-silver alloy or a mixture of the metals are more preferred. The cathode way be composed of not only a single layer of the compound or mixture described above but also a laminate structure containing the compound or mixture described above. Although a thickness of the cathode can be appropriately determined depending on the material to be used, it is preferably in a range of from 10 nm to 5 $\mu$m, more preferably from 50 nm to 1 $\mu$m, and still more preferably from 100 nm to 500 nm.

For the formation of cathode, an electron beam method, a spattering method, a vapor deposition method with resistance heating or a coating method can be used. It is possible to vapor-deposit an elemental metal or simultaneously vapor-deposit two or more ingredients. It is also possible to form an alloy electrode by simultaneous vapor deposition of two or more metals. Further, an alloy previously formed is subjected to vapor deposition.

The anode and cathode each preferably has a low sheet resistivity, specifically not more than several hundreds $\Omega$/square.

A material for forming the light-emitting layer may be any material capable of forming a layer which not only has such a function that upon application of an electric field, holes can be injected therein from the anode or from the hole-injecting layer or the hole-transporting layer and, at the same time, electrons can be injected therein from the cathode or from the electron-injecting layer or the electron-transporting layer, but also a function to allow the injected charges to move therethrough and a function to provide a place where the holes recombine with the electrons to cause emission. The material may be that emits light resulting from a singlet exciton or a triplet exciton. The light-emitting layer comprises preferably a transition metal complex, more preferably an ortho-metalized metal complex. The light-emitting layer may contain a luminescent material other than the metal complex. Examples of such other luminescent materials include a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a perylene derivative, a perinone derivative, an oxadiazole derivative, an aldazine derivative, a pyrralidine derivative, a cyclopentadiene derivative, a bisstylylanthracene derivative, a quinacridone derivative, a pyrrolopyridine derivative, a thiadiazolopyridine derivative, a cyclopentadiene derivative, a styrylamine derivative, an aromatic dimethylidyne derivative, various metal complexes represented by a metal complex of 8-quinolinol derivative or a rare earth metal complex, and a polymer compound, for example, polythiophene, polyphenylene or polyphenylenevinylene.

A thickness of the light-emitting layer is not particularly limited, but it is preferably in a range of from 1 nm to 5 $\mu$m, more preferably from 5 nm to 1 $\mu$m, and still more preferably from 10 nm to 500 nm.

A method for the formation of light-emitting layer is not particularly restricted and, for example, a vapor deposition method with resistance heating, an electron beam method, a spattering method, a molecular-layer accumulation method, a coating method (e.g., a spin coating method, a cast coating method or a dip coating method), a Langmuir-Blodgett (LB) method, an ink jet method, a printing method, a transfer method or an electrophotographic method can be used. Among them, the vapor deposition method with resistance heating and coating method is preferred.

A material for forming the hole-injecting layer or the hole-transporting layer may be any material which has such a function that holes can be injected therein from the anode or which functions to transport the holes or which functions to barrier the electrons injected from the cathode. Specific examples of such a material include a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne compound, a porphyrin compound, a polysilane compound, a poly(N-vinylcarbazole)derivative, an aniline copolymer, an electro-conductive high-molecular oligomer, for example, a thiophene oligomer or polythiophene, and a carbon film.

A thickness of the hole-injecting layer or the hole-transporting layer is not particularly limited, but it is preferably in a range of from 1 nm to 5 $\mu$m, more preferably from 5 nm to 1 $\mu$m, and still more preferably from 10 nm to 500 nm. The hole-injecting layer and the hole-transporting layer each may have a single-layer structure comprising one or more materials described above, or may have a multi-layer structure composed of two or more layers having the same or different compositions.

For the formation of hole-injecting layer or hole-transporting layer, a vapor deposition method, an LB method, an ink jet method, a printing method, a transfer method, an electrophotographic method or a coating method (e.g., a spin coating method, a cast coating method or a dip coating method) using a solution or dispersion of the hole-injecting or hole-transporting material described above in a solvent can be used. In case of using the coating method, the material can be dissolved or dispersed together with a resin component. Examples of the resin component include polyvinyl chloride, polycarbonate, polystyrene, polymethyl methacrylate, polybutylmethacrylate, polyester, polysulfone, polyphenylene oxide, polybutadiene, poly(N-vinylcarbazole), hydrocarbon resin, ketoneresin, phenoxy resin, polyamide, ethyl cellulose, polyvinyl acetate, ABS resin, polyurethane, melamine resin, unsaturated polyester resin, alkyd resin, epoxy resin and silicone resin.

A material for forming the electron-injecting layer or the electron-transporting layer may be any material which has such a function that electrons can be injected therein from the cathode or which functions to transport the electrons or which functions to barrier the holes injected from the anode. Specific examples of such a material include a triazole derivative, an oxazole derivative, an oxadiazole derivative, a fluorenone derivative, an anthraquinonedimethane derivative, an anthrone derivative, a diphenylquinone derivative, a thiopyran dioxide derivative, a carbodiimide derivative, a fluorenylidenemethane derivative, a distyrylpyrazine derivative, a tetracarboxylic anhydride of heterocyclic compound, for example, naphthalaneperillene, a phthalocyanine derivative, and various metal complexes represented by a metal complex of 8-quinolinol derivative, metal phthalocyanine or a metal complex containing benzoxazole or benzothiazole as a ligand.

A thickness of the electron-injecting layer or the electron-transporting layer is not particularly limited, but it is preferably in a range of from 1 nm to 5 µm, more preferably from 5 nm to 1 µm, and still more preferably from 10 nm to 500 nm. The electron-injecting layer and the electron-transporting layer each may have a single-layer structure comprising one or more materials described above, or may have a multi-layer structure composed of two or more layers having the same or different compositions.

For the formation of electron-injecting layer or electron-transporting layer, a vapor deposition method, an LB method, an inkjet method, a printing method, a transfer method, an electrophotographic method or a coating method (e.g., a spin coating method, a cast coating method or a dip coating method) using a solution or dispersion of the electron-injecting or electron-transporting material described above in a solvent can be used. In case of using the coating method, the material can be dissolved or dispersed together with a resin component. Examples of the resin component include, for example, those described with respect to the hole-injecting layer or the hole-transporting layer above.

A material for forming the protective layer may be any material which functions to inhibit any substance that accelerates degradation of the light-emitting device, for example, moisture or oxygen, from coming into the light-emitting device. Examples of such a material include metal, for example, In, Sn, Pb, Au, Cu, Ag, Al, Ti or Ni, a metal oxide, for example, MgO, SiO, $SiO_2$, $Al_2O_3$, GeO, NiO, CaO, BaO, $Fe_2O_3$, $Y_2O_3$ or $TiO_2$, a metal fluoride, for example, $MgF_2$, LiF, $AlF_3$ or $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture comprising tetrafluoroethylene and at least one comonomer, a fluorine-containing copolymer containing a cyclic structure in the main chain thereof, a water-absorbing substance having a water absorption rate of not less than 1%, and a moisture-preventing substance having a moisture absorption rate of not more than 0.1%.

A method for the formation of protective layer is not particularly limited and, for example, a vapor deposition method, a spattering method, a reactive spattering method, a molecular beam epitaxy (MBE) method, a cluster ion beam method, an ion plating method, a plasma polymerization (high-frequency excitation ion plating) method, a plasma CVD method, a laser CVD method, a heat CVD method, a gas-source CVD, a coating method, an ink jet method, a printing method or a transfer method can be employed.

EXAMPLES

The present invention will be explained in more detail with reference to the following examples, but the present invention should not be construed as being limited thereto.

COMPARATIVE EXAMPLE 1

On a cleaned ITO substrate in a deposition apparatus, TPD (N,N'-diphenyl-N,N'-di(m-tolyl)benzidine) was vapor-deposited so as to result in a thickness of 40 nm, then CBP (biscarbazolylbenzidine) and Luminescent Material (G-1) shown below were simultaneously vapor-deposited in a ratio of 10:1 so as to result in a thickness of 24 nm, and thereafter, Electron Transporting Material (ETM-1) shown below was vapor-deposited thereon so as to result in a thickness of 24 nm. A patterned mask (having a luminescent area of 4 mm×5 µm) was provided on the organic thin layer, and magnesium and silver were simultaneously vapor-deposited in a magnesium/silver ratio of 10/1 so as to result in a thickness of 250 nm and then silver was vapor-deposited so as to result in a thickness of 250 nm to prepare an electrolight-emitting device.

A direct current of constant-voltage was applied to the resulting electrolight-emitting device using a source measure unit (2400 Type manufactured by Toyo Technica Co., Ltd) to emit luminescence, and a luminance of the luminescence and a wavelength and a CIE chromaticity coordinate thereof were measured using a luminance meter (BM-8 Type manufactured by Topcon Corp.) and a spectral analyzer (PMA-11 Type manufactured by Hamamatsu Photonics K. K.), respectively. As a result, the maximum luminescent wavelength of the luminescence obtained was 486 nm, the luminance at a driving voltage of 8 V was 114 $cd/m^2$ and the external quantum yield was 6.0%.

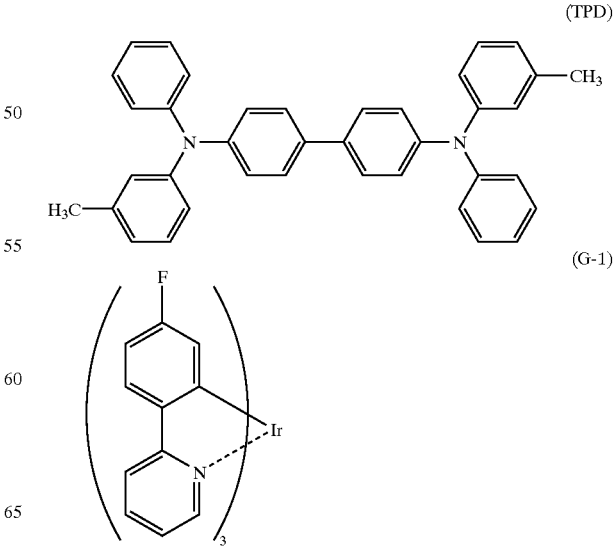

-continued

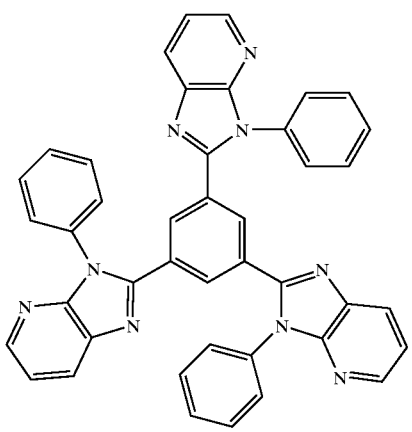
(ETM-1)

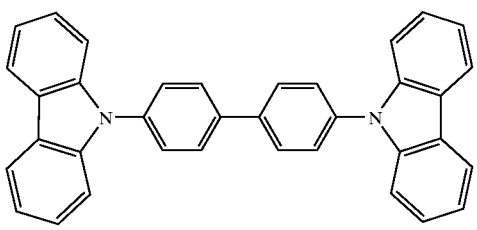
(CBP)

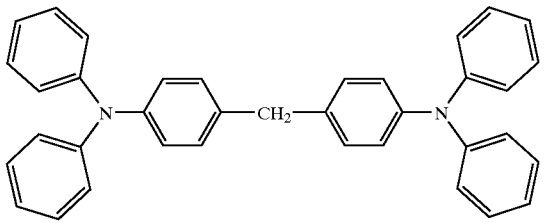
(HO-1)

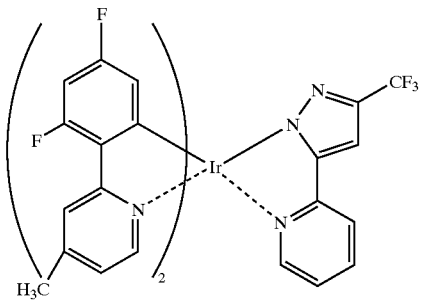
(B-1)

COMPARATIVE EXAMPLE 2

An electrolight-emitting device was prepared in the same manner as in Comparative Example 1, except for using BCP (2,9-dimethyl-4,7-diphenyl-1, 10-phenanthroline) in place of CBP and evaluated in the same manner as in Comparative Example 1. Luminescence was not observed at a driving voltage of 8 V.

EXAMPLE 1

An electrolight-emitting device was prepared in the same manner as in Comparative Example 1, except for using Compound (H-3) according to the present invention in place of CBP and evaluated in the same manner as in Comparative Example 1. As a result, the maximum luminescent wavelength of the luminescence obtained was 487 nm, the luminance at a driving voltage of 8 V was 120 cd/m$^2$ and the external quantum yield was 10.5%.

With each of the vapor deposition films of CBP, BCP and Compound (H-3) used as the host material in Comparative Examples 1 and 2 and Example 1 respectively, an ionization potential (IP) was measured by a photoelectron spectrometer (AC-1 Type manufactured by Riken Keiki Co., Ltd.). Further, an absorption spectrum of each of the vapor deposition films was measured and an energy gap was determined from the longer wavelength terminal of the absorption spectrum. The results obtained are shown in Table 1 below.

TABLE 1

| Host Material | Ionization Potential (eV) | Energy Gap (eV) |
|---|---|---|
| CBP (Comparative Example 1) | 6.10 | 3.40 |
| BCP (Comparative Example 2) | 6.70 | 3.50 |
| Compound (H-3) (Present Invention) | 6.13 | 3.90 |

From the results shown in Table 1, it is apparent that luminescence is not observed in the case of using BCP, while BCP has an energy gap broader than CBP. On the contrary, the compound, which has a broad energy gap and an ionization potential of from 5.4 to 6.3 eV, functions as the host material of a blue light-emitting device and enables to emit luminescence of high luminous efficiency.

EXAMPLE 2

On a cleaned substrate was spin-coated Baytron P (PEDOT-PSS solution (polyethylenedioxy thiophene-polystyrenesulfonic acid doped material) manufactured by Bayer Co., Ltd.) at 1,000 rpm for 30 seconds, and subjected to vacuum drying at 150° C. for 1.5 hours. A thickness of the organic layer formed was 70 nm. On the organic layer was spin-coated a solution containing 10 mg of Polycarbonate-Z, 20 mg of Compound CH-3) according to the present invention, 1 mg of Luminescent Material (G-1) and 6 mg of PBD (2-(4-biphenyl)-5-(4-tert-butylphenyl)-1,3,4-oxadiazole) dissolved in 2.5 g of dichloroethane at 2,000 rpm for 30 seconds. A thickness of the whole organic layer was 170 nm.

A patterned mask (having a luminescent area of 4 mm×5 mm) was provided on the organic thin layer and in a vapor deposition apparatus, magnesium and silver were simultaneously vapor-deposited in a magnesium/silver ratio of 10/1 so as to result in a thickness of 250 nm and then silver was vapor-deposited so as to result in a thickness of 250 nm.

A direct current of constant-voltage was applied to the resulting electrolight-emitting device to emit luminescence. As a result, the maximum luminescent wavelength of the luminescence obtained was 485 nm and the external quantum yield at 100 cd/m$^2$ was 5.3%.

EXAMPLE 3

A device was prepared in the same manner as in COMPARATIVE EXAMPLE 1, except for using a compound (H-17) according to the present invention in place of TPD. Then, a light emission spectrum and luminance thereof were measured and, when a light emission efficiency was calculated, the luminance and the external quantum efficiency at the time of driving voltage of 8V were 193 cd/m² and 7.1%, respectively. From these features, it is found that, when the compound according to the present invention is used as a hole-transporting material, it is possible to obtain a highly efficient luminescence.

EXAMPLE 4

A device was prepared and evaluated in the same manner as in EXAMPLE 1, except for using a compound (HO-1) according to the present invention in place of TPD and using a Luminescent Material (B-1), being capable of emitting light at lower wavelength than a wavelength at which a Luminescent Material (G-1 emits light, in place of a Luminescent Material (G-1). As a result, the maximum luminescent wavelength of the luminescence obtained was 459 nm and the external quantum yield was 12.7%. From these features, itis found that a host material of the present invention enables a blue light-emitting device to emit luminescence of high luminous efficiency.

According to the present invention, a light-emitting device which emits luminescence in a blue region in a high efficiency in comparison with a conventional device can be obtained, when a certain amount of driving voltage is applied. Also, a novel indole derivative is obtained.

While the invention has been described in detail and with reference to specific embodiments thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth herein.

What is claimed is:

1. A compound represented by the following formula (II):

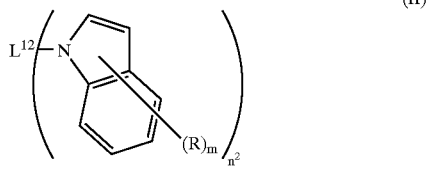

wherein $L^{12}$ represents one of a from 2- to 6-valent connecting group having a heteroaryl group and a from 2- to 6-valent connecting group comprising a non-conjugate connecting group having an arylene group; $n^2$ represents an integer of from 2 to 6; R represents one of an alkyl group having from 1 to 20 carbon atoms, an aryl group having from 6 to 20 carbon atoms, a heteroaryl group having from 2 to 20 carbon atoms and a silyl group having from 3 to 20 carbon atoms; and m represents an integer of from 0 to 6.

2. A light-emitting device comprising:

a pair of electrodes formed on a substrate; and at least one organic compound layer containing a light-emitting layer provided between the electrodes, wherein the at least one organic compound layer comprises at least one compound represented by the following formula (II):

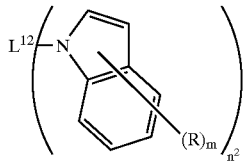

wherein $L^{12}$ represents one of a from 2- to 6-valent connecting group having a heteroaryl group and a from 2- to 6-valent connecting group comprising a non-conjugate connecting group having an arylene group; $n^2$ represents an integer of from 2 to 6; R represents one of an alkyl group having from 1 to 20 carbon atoms, an aryl group having from 6 to 20 carbon atoms, a heteroaryl group having from 2 to 20 carbon atoms and a silyl group having from 3 to 20 carbon atoms; and m represents an integer of from 0 to 6.

3. The light-emitting device of claim 2, wherein the light-emitting layer comprises the at least one compound represented by the formula (II) and at least one luminescent material.

4. The light-emitting device of claim 3, wherein the luminescent material is a transition metal complex.

5. The light-emitting device of claim 4, wherein the transition metal complex is capable of generating luminescence by a transition from a triplet excitation state thereof.

6. The light-emitting device of claim 2, wherein the light-emitting layer comprises a high molecular compound.

7. The light-emitting device of claim 2, wherein the light-emitting layer has a thickness of from 1 nm to 5 μm.

8. The light-emitting device of claim 4, wherein the transition metal complex is an ortho-metalated metal complex.

9. The light-emitting device of claim 4, wherein the transition metal complex is an ortho-metalated iridium complex.

10. The light-emitting device of claim 3, wherein the at least one compound represented by the formula (II) is from 0.1 to 95% by weight based on the luminescent material.

11. The compound of claim 1, wherein the heteroaryl group in $L^{12}$ is selected from the group consisting of pyridine, piperidine, pyrazine, triazine, thiophene, quinoline and quinoxaline, when $L^{12}$ represents one of a from 2- to 6-valent connecting group having a heteroaryl group.

12. The compound of claim 11, wherein the heteroaryl group in $L^{12}$ is selected from the group consisting of pyridine, piperidine, pyrazine and triazine.

13. The compound of claim 1, wherein the arylene group in $L^{12}$ is selected from the group consisting of phenylene, naphthylene, anthracenylene, phenanthrylene, pyrenylene and triphenylene, when $L^{12}$ represents one of a from 2- to 6-valent connecting group comprising a non-conjugate connecting group having an arylene group.

14. The compound of claim 13, wherein the aryl group in $L^{12}$ is phenylene.

15. The compound of claim 1, wherein the non-conjugate connecting group in $L^{12}$ is selected from the group consisting of an arylene group bonded at a meta position, an alkylene group, a silyl group, —O— and —N=.

16. The compound of claim 1, wherein $L^{12}$ is selected from the group consisting of:
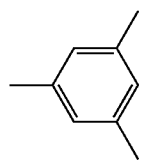 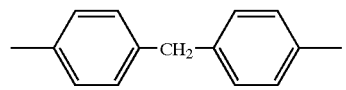
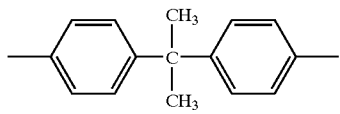
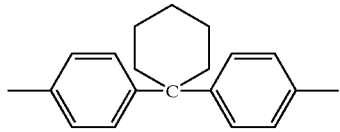
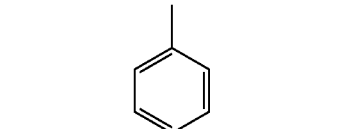
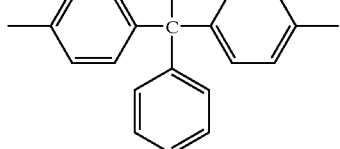
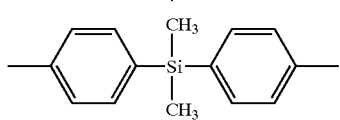
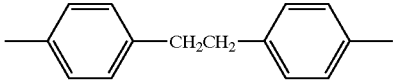
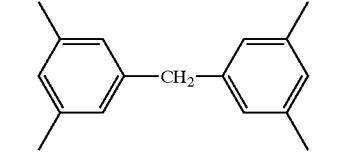
-continued
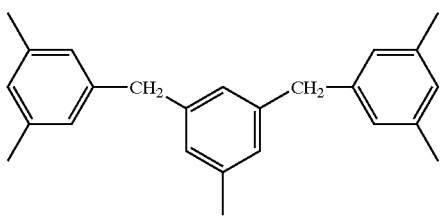
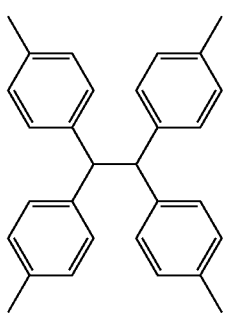
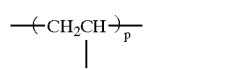
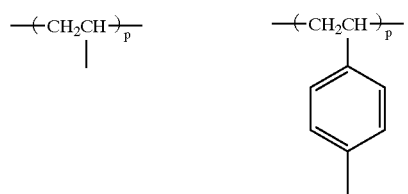
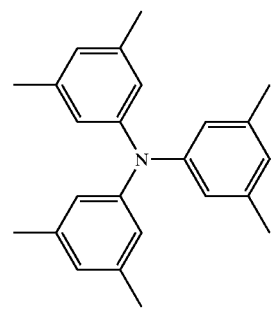
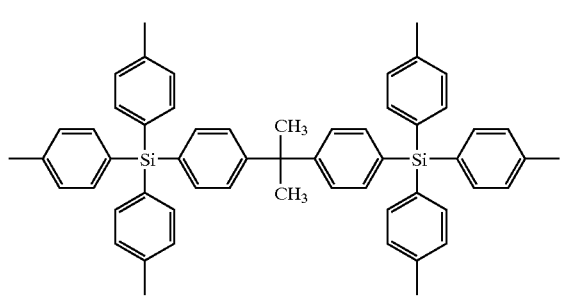
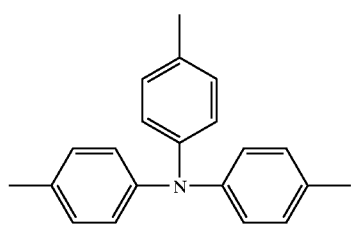

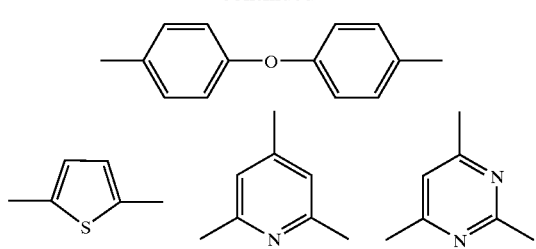
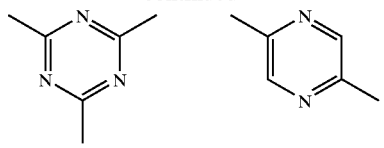
wherein p represents 1 to 500.
17. The compound of claim 1, wherein $n^2$ is 2.
18. The compound of claim 1, wherein $n^2$ is 3.
* * * * *